United States Patent [19]

Miyagawa et al.

[11] Patent Number: 5,477,494
[45] Date of Patent: Dec. 19, 1995

[54] APPARATUS FOR GENERATING ADDRESS BIT PATTERNS FOR TESTING SEMICONDUCTOR MEMORY DEVICES

[75] Inventors: Tadatoshi Miyagawa; Yasumitsu Tsutsui, both of Tokyo, Japan

[73] Assignee: Ando Electric Co., Ltd., Tokyo, Japan

[21] Appl. No.: 67,498

[22] Filed: May 25, 1993

[30] Foreign Application Priority Data

May 26, 1992 [JP] Japan .................................. 4-158542

[51] Int. Cl.[6] .................................................. G11C 7/00
[52] U.S. Cl. ................................................... 365/201
[58] Field of Search ................................ 371/15.1, 20.1, 371/21.1; 365/201

[56] References Cited

U.S. PATENT DOCUMENTS

| | | | |
|---|---|---|---|
| 4,520,453 | 6/1985 | Chow | 364/900 |
| 4,602,368 | 7/1986 | Circello et al. | 371/21 |
| 4,964,035 | 10/1990 | Aoyama et al. | 364/200 |
| 5,263,029 | 11/1993 | Wickland, Jr. | 371/21.1 |

Primary Examiner—Robert W. Beausoliel, Jr.
Assistant Examiner—Norman M. Wright
Attorney, Agent, or Firm—Panitch Schwarze Jacobs & Nadel

[57] ABSTRACT

An apparatus for testing a semiconductor memory device even of such a complicated addressing scheme that column address allocation differs from one to another row address. Memory cells of the memory device can be accessed in a desired sequence by changing over the conditions for address translation on a real-time basis. A pattern generator generates a plurality of addresses. A plurality of address bit selector circuits select optionally the addresses outputted from the pattern generator on a bit-by-bit basis. A plurality of switching circuits are provided for changing over a plurality of selected addresses outputted from the address bit selector circuits on a real-time basis. A plurality of address translation/memory circuits are supplied with a plurality of the addresses changed over by the switching circuits. A memory incorporated in each of address translation/memory circuits is divided into a plurality of memory areas selectable on a real-time basis. With the selected addresses switched in response to an address switching signal supplied from the pattern generator, address translation data stored in the memory areas selected by the address switching signal are read out and supplied to the semiconductor memory device under test for accessing memory cells thereof.

1 Claim, 14 Drawing Sheets

Fig. 4

| a | AY 2 1 0 | AX 2 1 0 | a | AY 2 1 0 | AX 2 1 0 |
|---|---|---|---|---|---|
| 0 | 0 0 0 | 0 0 0 | 32 | 1 0 0 | 0 0 0 |
| 1 | | 0 0 1 | 33 | | 0 0 1 |
| 2 | | 0 1 0 | 34 | | 0 1 0 |
| 3 | | 0 1 1 | 35 | | 0 1 1 |
| 4 | | 1 0 0 | 36 | | 1 0 0 |
| 5 | | 1 0 1 | 37 | | 1 0 1 |
| 6 | | 1 1 0 | 38 | | 1 1 0 |
| 7 | | 1 1 1 | 39 | | 1 1 1 |
| 8 | 0 0 1 | 0 0 0 | 40 | 1 0 1 | 0 0 0 |
| 9 | | 0 0 1 | 41 | | 0 0 1 |
| 10 | | 0 1 0 | 42 | | 0 1 0 |
| 11 | | 0 1 1 | 43 | | 0 1 1 |
| 12 | | 1 0 0 | 44 | | 1 0 0 |
| 13 | | 1 0 1 | 45 | | 1 0 1 |
| 14 | | 1 1 0 | 46 | | 1 1 0 |
| 15 | | 1 1 1 | 47 | | 1 1 1 |
| 16 | 0 1 0 | 0 0 0 | 48 | 1 1 0 | 0 0 0 |
| 17 | | 0 0 1 | 49 | | 0 0 1 |
| 18 | | 0 1 0 | 50 | | 0 1 0 |
| 19 | | 0 1 1 | 51 | | 0 1 1 |
| 20 | | 1 0 0 | 52 | | 1 0 0 |
| 21 | | 1 0 1 | 53 | | 1 0 1 |
| 22 | | 1 1 0 | 54 | | 1 1 0 |
| 23 | | 1 1 1 | 55 | | 1 1 1 |
| 24 | 0 1 1 | 0 0 0 | 56 | 1 1 1 | 0 0 0 |
| 25 | | 0 0 1 | 57 | | 0 0 1 |
| 26 | | 0 1 0 | 58 | | 0 1 0 |
| 27 | | 0 1 1 | 59 | | 0 1 1 |
| 28 | | 1 0 0 | 60 | | 1 0 0 |
| 29 | | 1 0 1 | 61 | | 1 0 1 |
| 30 | | 1 1 0 | 62 | | 1 1 0 |
| 31 | | 1 1 1 | 63 | | 1 1 1 |

Fig. 5

| a | AY 2 1 0 | AX 2 1 0 |
|---|---|---|
| 0 |  | 0 0 1 |
| 1 |  | 0 0 0 |
| 2 |  | 0 1 1 |
| 3 | 0 0 0 | 0 1 0 |
| 4 |  | 1 0 1 |
| 5 |  | 1 0 0 |
| 6 |  | 1 1 1 |
| 7 |  | 1 1 0 |
| 8 |  | 0 0 1 |
| 9 |  | 0 0 0 |
| 10 |  | 0 1 1 |
| 11 | 0 0 1 | 0 1 0 |
| 12 |  | 1 0 1 |
| 13 |  | 1 0 0 |
| 14 |  | 1 1 1 |
| 15 |  | 1 1 0 |
| 16 |  | 0 0 1 |
| 17 |  | 0 0 0 |
| 18 |  | 0 1 1 |
| 19 | 0 1 0 | 0 1 0 |
| 20 |  | 1 0 1 |
| 21 |  | 1 0 0 |
| 22 |  | 1 1 1 |
| 23 |  | 1 1 0 |
| 24 |  | 0 0 1 |
| 25 |  | 0 0 0 |
| 26 |  | 0 1 1 |
| 27 | 0 1 1 | 0 1 0 |
| 28 |  | 1 0 1 |
| 29 |  | 1 0 0 |
| 30 |  | 1 1 1 |
| 31 |  | 1 1 0 |

| a | AY 2 1 0 | AX 2 1 0 |
|---|---|---|
| 32 |  | 0 1 0 |
| 33 |  | 0 1 1 |
| 34 |  | 0 0 0 |
| 35 | 1 0 0 | 0 0 1 |
| 36 |  | 1 1 0 |
| 37 |  | 1 1 1 |
| 38 |  | 1 0 0 |
| 39 |  | 1 0 1 |
| 40 |  | 0 1 0 |
| 41 |  | 0 1 1 |
| 42 |  | 0 0 0 |
| 43 | 1 0 1 | 0 0 1 |
| 44 |  | 1 1 0 |
| 45 |  | 1 1 1 |
| 46 |  | 1 0 0 |
| 47 |  | 1 0 1 |
| 48 |  | 0 1 0 |
| 49 |  | 0 1 1 |
| 50 |  | 0 0 0 |
| 51 | 1 1 0 | 0 0 1 |
| 52 |  | 1 1 0 |
| 53 |  | 1 1 1 |
| 54 |  | 1 0 0 |
| 55 |  | 1 0 1 |
| 56 |  | 0 1 0 |
| 57 |  | 0 1 1 |
| 58 |  | 0 0 0 |
| 59 | 1 1 1 | 0 0 1 |
| 60 |  | 1 1 0 |
| 61 |  | 1 1 1 |
| 62 |  | 1 0 0 |
| 63 |  | 1 0 1 |

Fig.6A

| INPUT ADDRESS 11, 12 | SELECTED X-ADDRESS 13 |
|---|---|
| $X_0$ | $SX_0$ |
| $X_1$ | $SX_1$ |
| $Y_2$ | $SX_2$ |

Fig.6B

| INPUT ADDRESS 11, 12 | SELECTED X-ADDRESS 14 |
|---|---|
| $Y_0$ | $SY_0$ |
| $Y_1$ | $SY_1$ |
| $X_2$ | $SY_2$ |

| $SX_2$ | $SX_1$ | $SX_0$ | |
|---|---|---|---|
| 0 | 0 | 0 | $MX_2=0, MX_1=0, MX_0=1$ |
| 0 | 0 | 1 | $MX_2=0, MX_1=0, MX_0=0$ |
| 0 | 1 | 0 | $MX_2=0, MX_1=1, MX_0=1$ |
| 0 | 1 | 1 | $MX_2=0, MX_1=1, MX_0=0$ |
| 1 | 0 | 0 | $MX_2=1, MX_1=1, MX_0=0$ |
| 1 | 0 | 1 | $MX_2=1, MX_1=1, MX_0=1$ |
| 1 | 1 | 0 | $MX_2=1, MX_1=0, MX_0=0$ |
| 1 | 1 | 1 | $MX_2=1, MX_1=0, MX_0=1$ |

| $SY_2$ | $SY_1$ | $SY_0$ | |
|---|---|---|---|
| 0 | 0 | 0 | $MY_2=0, MY_1=0, MY_0=0$ |
| 0 | 0 | 1 | $MY_2=0, MY_1=0, MY_0=1$ |
| 0 | 1 | 0 | $MY_2=0, MY_1=1, MY_0=0$ |
| 0 | 1 | 1 | $MY_2=0, MY_1=1, MY_0=1$ |
| 1 | 0 | 0 | $MY_2=1, MY_1=0, MY_0=0$ |
| 1 | 0 | 1 | $MY_2=1, MY_1=0, MY_0=1$ |
| 1 | 1 | 0 | $MY_2=1, MY_1=1, MY_0=0$ |
| 1 | 1 | 1 | $MY_2=1, MY_1=1, MY_0=1$ |

| MEMORY ADDRESS 17, 18 | EXTERNAL TERMINALS 102, 106 MEMORY UNDER TEST |
|---|---|
| $MX_0$ | $AX_0$ |
| $MX_1$ | $AX_1$ |
| $MX_2$ | $AY_2$ |
| $MY_0$ | $AY_0$ |
| $MY_1$ | $AY_1$ |
| $MY_2$ | $AX_2$ |

Fig. 9

| a | AY 2 1 0 | AX 2 1 0 |
|---|---|---|
| 0 | 0 0 0 | 0 0 1 |
| 1 | | 0 0 0 |
| 2 | | 0 1 1 |
| 3 | | 0 1 0 |
| 4 | | 1 0 1 |
| 5 | | 1 0 0 |
| 6 | | 1 1 1 |
| 7 | | 1 1 0 |
| 8 | 0 0 1 | 0 0 1 |
| 9 | | 0 0 0 |
| 10 | | 0 1 1 |
| 11 | | 0 1 0 |
| 12 | | 1 0 1 |
| 13 | | 1 0 0 |
| 14 | | 1 1 1 |
| 15 | | 1 1 0 |
| 16 | 0 1 0 | 0 0 1 |
| 17 | | 0 0 0 |
| 18 | | 0 1 1 |
| 19 | | 0 1 0 |
| 20 | | 1 0 1 |
| 21 | | 1 0 0 |
| 22 | | 1 1 1 |
| 23 | | 1 1 0 |
| 24 | 0 1 1 | 0 0 1 |
| 25 | | 0 0 0 |
| 26 | | 0 1 1 |
| 27 | | 0 1 0 |
| 28 | | 1 0 1 |
| 29 | | 1 0 0 |
| 30 | | 1 1 1 |
| 31 | | 1 1 0 |
| 32 | 1 0 0 | 0 1 0 |
| 33 | | 0 1 1 |
| 34 | | 0 0 0 |
| 35 | | 0 0 1 |
| 36 | | 1 1 0 |
| 37 | | 1 1 1 |
| 38 | | 1 0 0 |
| 39 | | 1 0 1 |
| 40 | 1 0 1 | 0 1 0 |
| 41 | | 0 1 1 |
| 42 | | 0 0 0 |
| 43 | | 0 0 1 |
| 44 | | 1 1 0 |
| 45 | | 1 1 1 |
| 46 | | 1 0 0 |
| 47 | | 1 0 1 |
| 48 | 1 1 0 | 0 1 0 |
| 49 | | 0 1 1 |
| 50 | | 0 0 0 |
| 51 | | 0 0 1 |
| 52 | | 1 1 0 |
| 53 | | 1 1 1 |
| 54 | | 1 0 0 |
| 55 | | 1 0 1 |
| 56 | 1 1 1 | 0 1 0 |
| 57 | | 0 1 1 |
| 58 | | 0 0 0 |
| 59 | | 0 0 1 |
| 60 | | 1 1 0 |
| 61 | | 1 1 1 |
| 62 | | 1 0 0 |
| 63 | | 1 0 1 |

Fig. 10

| a | AY 2 1 0 | AX 2 1 0 |
|---|---|---|
| 0 | 0 0 0 | 0 0 1 |
| 1 |  | 0 0 0 |
| 2 |  | 0 1 1 |
| 3 |  | 0 1 0 |
| 4 |  | 1 0 1 |
| 5 |  | 1 0 0 |
| 6 |  | 1 1 1 |
| 7 |  | 1 1 0 |
| 8 | 0 1 0 | 0 0 1 |
| 9 |  | 0 0 0 |
| 10 |  | 0 1 1 |
| 11 |  | 0 1 0 |
| 12 |  | 1 0 1 |
| 13 |  | 1 0 0 |
| 14 |  | 1 1 1 |
| 15 |  | 1 1 0 |
| 16 | 1 0 0 | 0 1 0 |
| 17 |  | 0 1 1 |
| 18 |  | 0 0 0 |
| 19 |  | 0 0 1 |
| 20 |  | 1 1 0 |
| 21 |  | 1 1 1 |
| 22 |  | 1 0 0 |
| 23 |  | 1 0 1 |
| 32 | 1 1 0 | 0 1 0 |
| 33 |  | 0 1 1 |
| 34 |  | 0 0 0 |
| 35 |  | 0 0 1 |
| 36 |  | 1 1 0 |
| 37 |  | 1 1 1 |
| 38 |  | 1 0 0 |
| 39 |  | 1 0 1 |

| a | AY 2 1 0 | AX 2 1 0 |
|---|---|---|
| 48 | 0 0 0 | 0 0 1 |
| 49 |  | 0 0 0 |
| 50 |  | 0 1 1 |
| 51 |  | 0 1 0 |
| 52 |  | 1 0 1 |
| 53 |  | 1 0 0 |
| 54 |  | 1 1 1 |
| 55 |  | 1 1 0 |
| 0 | 0 1 0 | 0 0 1 |
| 1 |  | 0 0 0 |
| 2 |  | 0 1 1 |
| 3 |  | 0 1 0 |
| 4 |  | 1 0 1 |
| 5 |  | 1 0 0 |
| 6 |  | 1 1 1 |
| 7 |  | 1 1 0 |
| 16 | 1 0 0 | 0 1 0 |
| 17 |  | 0 1 1 |
| 18 |  | 0 0 0 |
| 19 |  | 0 0 1 |
| 20 |  | 1 1 0 |
| 21 |  | 1 1 1 |
| 22 |  | 1 0 0 |
| 23 |  | 1 0 1 |
| 32 | 1 1 0 | 0 1 0 |
| 33 |  | 0 1 1 |
| 34 |  | 0 0 0 |
| 35 |  | 0 0 1 |
| 36 |  | 1 1 0 |
| 37 |  | 1 1 1 |
| 38 |  | 1 0 0 |
| 39 |  | 1 0 1 |

Fig.11A

| INPUT ADDRESS 11, 12 | SELECTED X-ADDRESS 13A |
|---|---|
| $X_0$ | $SX_0$ |
| $X_1$ | $SX_1$ |
| $Y_2$ | $SX_2$ |

2A

| INPUT ADDRESS 11, 12 | SELECTED Y-ADDRESS 14A |
|---|---|
| $Y_0$ | $SY_0$ |
| $Y_1$ | $SY_1$ |
| $X_2$ | $SY_2$ |

| INPUT ADDRESS 11, 12 | SELECTED X-ADDRESS 13B |
|---|---|
| $X_0$ | $SX_0$ |
| $X_1$ | $SX_1$ |
| $Y_1$ | $SX_2$ |

2B

| INPUT ADDRESS 11, 12 | SELECTED Y-ADDRESS 14B |
|---|---|
| $Y_0$ | $SY_0$ |
| $Y_2$ | $SY_1$ |
| $X_2$ | $SY_2$ |

| J | $RX_2, RX_1, RX_0$ | 4 / 4-1 |
|---|---|---|
| 0 | 0 0 0 | $MX_2=0, MX_1=0, MX_0=1$ |
| 0 | 0 0 1 | $MX_2=0, MX_1=0, MX_0=0$ |
| 0 | 0 1 0 | $MX_2=0, MX_1=1, MX_0=1$ |
| 0 | 0 1 1 | $MX_2=0, MX_1=1, MX_0=0$ |
| 0 | 1 0 0 | $MX_2=1, MX_1=1, MX_0=0$ |
| 0 | 1 0 1 | $MX_2=1, MX_1=1, MX_0=1$ |
| 0 | 1 1 0 | $MX_2=1, MX_1=0, MX_0=0$ |
| 0 | 1 1 1 | $MX_2=1, MX_1=0, MX_0=1$ |
| ⋮ | ⋮ ⋮ ⋮ | ⋮ |

| J | $RY_2, RY_1, RY_0$ | 5 / 5-1 |
|---|---|---|
| 0 | 0 0 0 | $MY_2=0, MY_1=0, MY_0=0$ |
| 0 | 0 0 1 | $MY_2=0, MY_1=0, MY_0=1$ |
| 0 | 0 1 0 | $MY_2=0, MY_1=1, MY_0=0$ |
| 0 | 0 1 1 | $MY_2=0, MY_1=1, MY_0=1$ |
| 0 | 1 0 0 | $MY_2=1, MY_1=0, MY_0=0$ |
| 0 | 1 0 1 | $MY_2=1, MY_1=0, MY_0=1$ |
| 0 | 1 1 0 | $MY_2=1, MY_1=1, MY_0=0$ |
| 0 | 1 1 1 | $MY_2=1, MY_1=1, MY_0=1$ |
| ⋮ | ⋮ ⋮ ⋮ | ⋮ |

| | | | | 4 / 4-2 |
|---|---|---|---|---|
| 1 | 0 | 0 | 0 | $MX_2=0, MX_1=0, MX_0=1$ |
| 1 | 0 | 0 | 1 | $MX_2=0, MX_1=0, MX_0=0$ |
| 1 | 0 | 1 | 0 | $MX_2=0, MX_1=1, MX_0=1$ |
| 1 | 0 | 1 | 1 | $MX_2=0, MX_1=1, MX_0=0$ |
| 1 | 1 | 0 | 0 | $MX_2=1, MX_1=1, MX_0=0$ |
| 1 | 1 | 0 | 1 | $MX_2=1, MX_1=1, MX_0=1$ |
| 1 | 1 | 1 | 0 | $MX_2=1, MX_1=0, MX_0=0$ |
| 1 | 1 | 1 | 1 | $MX_2=1, MX_1=0, MX_0=1$ |
| ⋮ | ⋮ | ⋮ | ⋮ | ⋮ |

| | | | | 5 / 5-2 |
|---|---|---|---|---|
| 1 | 0 | 0 | 0 | $MY_2=0, MY_1=0, MY_0=0$ |
| 1 | 0 | 0 | 1 | $MY_2=0, MY_1=1, MY_0=0$ |
| 1 | 0 | 1 | 0 | $MY_2=0, MY_1=0, MY_0=0$ |
| 1 | 0 | 1 | 1 | $MY_2=0, MY_1=1, MY_0=0$ |
| 1 | 1 | 0 | 0 | $MY_2=1, MY_1=0, MY_0=0$ |
| 1 | 1 | 0 | 1 | $MY_2=1, MY_1=1, MY_0=0$ |
| 1 | 1 | 1 | 0 | $MY_2=1, MY_1=0, MY_0=0$ |
| 1 | 1 | 1 | 1 | $MY_2=1, MY_1=1, MY_0=0$ |
| ⋮ | ⋮ | ⋮ | ⋮ | ⋮ |

| ADDRESS ACCESS NUMBER | Y-ADDRESS 12 | | | X-ADDRESS 11 | | | ADDRESS ACCESS NUMBER | Y-ADDRESS 12 | | | X-ADDRESS 11 | | |
|---|---|---|---|---|---|---|---|---|---|---|---|---|---|
| | Y | | | X | | | | Y | | | X | | |
| | 2 | 1 | 0 | 2 | 1 | 0 | | 2 | 1 | 0 | 2 | 1 | 0 |
| 0 | 0 | 0 | 0 | 0 | 0 | 0 | 32 | 1 | 0 | 0 | 0 | 0 | 0 |
| 1 | | | | 0 | 0 | 1 | 33 | | | | 0 | 0 | 1 |
| 2 | | | | 0 | 1 | 0 | 34 | | | | 0 | 1 | 0 |
| 3 | | | | 0 | 1 | 1 | 35 | | | | 0 | 1 | 1 |
| 4 | | | | 1 | 0 | 0 | 36 | | | | 1 | 0 | 0 |
| 5 | | | | 1 | 0 | 1 | 37 | | | | 1 | 0 | 1 |
| 6 | | | | 1 | 1 | 0 | 38 | | | | 1 | 1 | 0 |
| 7 | | | | 1 | 1 | 1 | 39 | | | | 1 | 1 | 1 |
| 8 | 0 | 0 | 1 | 0 | 0 | 0 | 40 | 1 | 0 | 1 | 0 | 0 | 0 |
| 9 | | | | 0 | 0 | 1 | 41 | | | | 0 | 0 | 1 |
| 10 | | | | 0 | 1 | 0 | 42 | | | | 0 | 1 | 0 |
| 11 | | | | 0 | 1 | 1 | 43 | | | | 0 | 1 | 1 |
| 12 | | | | 1 | 0 | 0 | 44 | | | | 1 | 0 | 0 |
| 13 | | | | 1 | 0 | 1 | 45 | | | | 1 | 0 | 1 |
| 14 | | | | 1 | 1 | 0 | 46 | | | | 1 | 1 | 0 |
| 15 | | | | 1 | 1 | 1 | 47 | | | | 1 | 1 | 1 |
| 16 | 0 | 1 | 0 | 0 | 0 | 0 | 48 | 1 | 1 | 0 | 0 | 0 | 0 |
| 17 | | | | 0 | 0 | 1 | 49 | | | | 0 | 0 | 1 |
| 18 | | | | 0 | 1 | 0 | 50 | | | | 0 | 1 | 0 |
| 19 | | | | 0 | 1 | 1 | 51 | | | | 0 | 1 | 1 |
| 20 | | | | 1 | 0 | 0 | 52 | | | | 1 | 0 | 0 |
| 21 | | | | 1 | 0 | 1 | 53 | | | | 1 | 0 | 1 |
| 22 | | | | 1 | 1 | 0 | 54 | | | | 1 | 1 | 0 |
| 23 | | | | 1 | 1 | 1 | 55 | | | | 1 | 1 | 1 |
| 24 | 0 | 1 | 1 | 0 | 0 | 0 | 56 | 1 | 1 | 1 | 0 | 0 | 0 |
| 25 | | | | 0 | 0 | 1 | 57 | | | | 0 | 0 | 1 |
| 26 | | | | 0 | 1 | 0 | 58 | | | | 0 | 1 | 0 |
| 27 | | | | 0 | 1 | 1 | 59 | | | | 0 | 1 | 1 |
| 28 | | | | 1 | 0 | 0 | 60 | | | | 1 | 0 | 0 |
| 29 | | | | 1 | 0 | 1 | 61 | | | | 1 | 0 | 1 |
| 30 | | | | 1 | 1 | 0 | 62 | | | | 1 | 1 | 0 |
| 31 | | | | 1 | 1 | 1 | 63 | | | | 1 | 1 | 1 |

Fig. 14

| ADDRESS ACCESS NUMBER | SELECTED Y-ADDRESS 14A SY 2 1 0 | SELECTED X-ADDRESS 13A SX 2 1 0 | ADDRESS ACCESS NUMBER | SELECTED Y-ADDRESS 14A SY 2 1 0 | SELECTED X-ADDRESS 13A SX 2 1 0 |
|---|---|---|---|---|---|
| 0 | 0 0 0 | 0 0 0 | 32 | 0 0 0 | 1 0 0 |
| 1 | | 0 0 1 | 33 | | 1 0 1 |
| 2 | | 0 1 0 | 34 | | 1 1 0 |
| 3 | | 0 1 1 | 35 | | 1 1 1 |
| 4 | 1 0 0 | 0 0 0 | 36 | 1 0 0 | 1 0 0 |
| 5 | | 0 0 1 | 37 | | 1 0 1 |
| 6 | | 0 1 0 | 38 | | 1 1 0 |
| 7 | | 0 1 1 | 39 | | 1 1 1 |
| 8 | 0 0 1 | 0 0 0 | 40 | 0 0 1 | 1 0 0 |
| 9 | | 0 0 1 | 41 | | 1 0 1 |
| 10 | | 0 1 0 | 42 | | 1 1 0 |
| 11 | | 0 1 1 | 43 | | 1 1 1 |
| 12 | 1 0 1 | 0 0 0 | 44 | 1 0 1 | 1 0 0 |
| 13 | | 0 0 1 | 45 | | 1 0 1 |
| 14 | | 0 1 0 | 46 | | 1 1 0 |
| 15 | | 0 1 1 | 47 | | 1 1 1 |
| 16 | 0 1 0 | 0 0 0 | 48 | 0 1 0 | 1 0 0 |
| 17 | | 0 0 1 | 49 | | 1 0 1 |
| 18 | | 0 1 0 | 50 | | 1 1 0 |
| 19 | | 0 1 1 | 51 | | 1 1 1 |
| 20 | 1 1 0 | 0 0 0 | 52 | 1 1 0 | 1 0 0 |
| 21 | | 0 0 1 | 53 | | 1 0 1 |
| 22 | | 0 1 0 | 54 | | 1 1 0 |
| 23 | | 0 1 1 | 55 | | 1 1 1 |
| 24 | 0 1 1 | 0 0 0 | 56 | 0 1 1 | 1 0 0 |
| 25 | | 0 0 1 | 57 | | 1 0 1 |
| 26 | | 0 1 0 | 58 | | 1 1 0 |
| 27 | | 0 1 1 | 59 | | 1 1 1 |
| 28 | 1 1 1 | 0 0 0 | 60 | 1 1 1 | 1 0 0 |
| 29 | | 0 0 1 | 61 | | 1 0 1 |
| 30 | | 0 1 0 | 62 | | 1 1 0 |
| 31 | | 0 1 1 | 63 | | 1 1 1 |

| ADDRESS ACCESS NUMBER | SELECTED Y-ADDRESS 14B SY 2 1 0 | SELECTED X-ADDRESS 13B SX 2 1 0 | ADDRESS ACCESS NUMBER | SELECTED Y-ADDRESS 14B SY 2 1 0 | SELECTED X-ADDRESS 13B SX 2 1 0 |
|---|---|---|---|---|---|
| 0 | 0 0 0 | 0 0 0 | 32 | 0 1 0 | 0 0 0 |
| 1 | | 0 0 1 | 33 | | 0 0 1 |
| 2 | | 0 1 0 | 34 | | 0 1 0 |
| 3 | | 0 1 1 | 35 | | 0 1 1 |
| 4 | 1 0 0 | 0 0 0 | 36 | 1 1 0 | 0 0 0 |
| 5 | | 0 0 1 | 37 | | 0 0 1 |
| 6 | | 0 1 0 | 38 | | 0 1 0 |
| 7 | | 0 1 1 | 39 | | 0 1 1 |
| 8 | 0 0 1 | 0 0 0 | 40 | 0 1 1 | 0 0 0 |
| 9 | | 0 0 1 | 41 | | 0 0 1 |
| 10 | | 0 1 0 | 42 | | 0 1 0 |
| 11 | | 0 1 1 | 43 | | 0 1 1 |
| 12 | 1 0 1 | 0 0 0 | 44 | 1 1 1 | 0 0 0 |
| 13 | | 0 0 1 | 45 | | 0 0 1 |
| 14 | | 0 1 0 | 46 | | 0 1 0 |
| 15 | | 0 1 1 | 47 | | 0 1 1 |
| 16 | 0 0 0 | 0 0 0 | 48 | 0 1 0 | 0 0 0 |
| 17 | | 0 0 1 | 49 | | 0 0 1 |
| 18 | | 0 1 0 | 50 | | 0 1 0 |
| 19 | | 0 1 1 | 51 | | 0 1 1 |
| 20 | 1 0 0 | 0 0 0 | 52 | 1 1 0 | 0 0 0 |
| 21 | | 0 0 1 | 53 | | 0 0 1 |
| 22 | | 0 1 0 | 54 | | 0 1 0 |
| 23 | | 0 1 1 | 55 | | 0 1 1 |
| 24 | 0 0 1 | 0 0 0 | 56 | 0 1 1 | 0 0 0 |
| 25 | | 0 0 1 | 57 | | 0 0 1 |
| 26 | | 0 1 0 | 58 | | 0 1 0 |
| 27 | | 0 1 1 | 59 | | 0 1 1 |
| 28 | 1 0 1 | 0 0 0 | 60 | 1 1 1 | 0 0 0 |
| 29 | | 0 0 1 | 61 | | 0 0 1 |
| 30 | | 0 1 0 | 62 | | 0 1 0 |
| 31 | | 0 1 1 | 63 | | 0 1 1 |

| ADDRESS ACCESS NUMBER | MEMORY Y-ADDRESS 18 MY 2 1 0 | MEMORY X-ADDRESS 17 MX 2 1 0 | ADDRESS ACCESS NUMBER | MEMORY Y-ADDRESS 18 AY 2 1 0 | MEMORY X-ADDRESS 17 AX 2 1 0 |
|---|---|---|---|---|---|
| 0 | 0 0 0 | 0 0 1 | 32 | 0 0 0 | 1 1 0 |
| 1 |  | 0 0 0 | 33 |  | 1 1 1 |
| 2 |  | 0 1 1 | 34 |  | 1 0 0 |
| 3 |  | 0 1 0 | 35 |  | 1 0 1 |
| 4 | 1 0 0 | 0 0 1 | 36 | 1 0 0 | 1 1 0 |
| 5 |  | 0 0 0 | 37 |  | 1 1 1 |
| 6 |  | 0 1 1 | 38 |  | 1 0 0 |
| 7 |  | 0 1 0 | 39 |  | 1 0 1 |
| 8 | 0 0 1 | 0 0 1 | 40 | 0 0 1 | 1 1 0 |
| 9 |  | 0 0 0 | 41 |  | 1 1 1 |
| 10 |  | 0 1 1 | 42 |  | 1 0 0 |
| 11 |  | 0 1 0 | 43 |  | 1 0 1 |
| 12 | 1 0 1 | 0 0 1 | 44 | 1 0 1 | 1 1 0 |
| 13 |  | 0 0 0 | 45 |  | 1 1 1 |
| 14 |  | 0 1 1 | 46 |  | 1 0 0 |
| 15 |  | 0 1 0 | 47 |  | 1 0 1 |
| 16 | 0 1 0 | 0 0 1 | 48 | 0 1 0 | 1 1 0 |
| 17 |  | 0 0 0 | 49 |  | 1 1 1 |
| 18 |  | 0 1 1 | 50 |  | 1 0 0 |
| 19 |  | 0 1 0 | 51 |  | 1 0 1 |
| 20 | 1 1 0 | 0 0 1 | 52 | 1 1 0 | 1 1 0 |
| 21 |  | 0 0 0 | 53 |  | 1 1 1 |
| 22 |  | 0 1 1 | 54 |  | 1 0 0 |
| 23 |  | 0 1 0 | 55 |  | 1 0 1 |
| 24 | 0 1 1 | 0 0 1 | 56 | 0 1 1 | 1 1 0 |
| 25 |  | 0 0 0 | 57 |  | 1 1 1 |
| 26 |  | 0 1 1 | 58 |  | 1 0 0 |
| 27 |  | 0 1 0 | 59 |  | 1 0 1 |
| 28 | 1 1 1 | 0 0 1 | 60 | 1 1 1 | 1 1 0 |
| 29 |  | 0 0 0 | 61 |  | 1 1 1 |
| 30 |  | 0 1 1 | 62 |  | 1 0 0 |
| 31 |  | 0 1 0 | 63 |  | 1 0 1 |

| ADDRESS ACCESS NUMBER | MEMORY Y-ADDRESS 18 MY 2 1 0 | MEMORY X-ADDRESS 17 MX 2 1 0 | ADDRESS ACCESS NUMBER | MEMORY Y-ADDRESS 18 AY 2 1 0 | MEMORY X-ADDRESS 17 AX 2 1 0 |
|---|---|---|---|---|---|
| 0 | 0 0 0 | 0 0 1 | 32 | 0 0 0 | 0 0 1 |
| 1 |  | 0 0 0 | 33 |  | 0 0 0 |
| 2 |  | 0 1 1 | 34 |  | 0 1 1 |
| 3 |  | 0 1 0 | 35 |  | 0 1 0 |
| 4 | 1 0 0 | 0 0 1 | 36 | 1 0 0 | 0 0 1 |
| 5 |  | 0 0 0 | 37 |  | 0 0 0 |
| 6 |  | 0 1 1 | 38 |  | 0 1 1 |
| 7 |  | 0 1 0 | 39 |  | 0 1 0 |
| 8 | 0 1 0 | 0 0 1 | 40 | 0 1 0 | 0 0 1 |
| 9 |  | 0 0 0 | 41 |  | 0 0 0 |
| 10 |  | 0 1 1 | 42 |  | 0 1 1 |
| 11 |  | 0 1 0 | 43 |  | 0 1 0 |
| 12 | 1 1 0 | 0 0 1 | 44 | 1 1 0 | 0 0 1 |
| 13 |  | 0 0 0 | 45 |  | 0 0 0 |
| 14 |  | 0 1 1 | 46 |  | 0 1 1 |
| 15 |  | 0 1 0 | 47 |  | 0 1 0 |
| 16 | 0 0 0 | 1 1 0 | 48 | 0 0 0 | 1 1 0 |
| 17 |  | 1 1 1 | 49 |  | 1 1 1 |
| 18 |  | 1 0 0 | 50 |  | 1 0 0 |
| 19 |  | 1 0 1 | 51 |  | 1 0 1 |
| 20 | 1 0 0 | 1 1 0 | 52 | 1 0 0 | 1 1 0 |
| 21 |  | 1 1 1 | 53 |  | 1 1 1 |
| 22 |  | 1 0 0 | 54 |  | 1 0 0 |
| 23 |  | 1 0 1 | 55 |  | 1 0 1 |
| 24 | 0 1 0 | 1 1 0 | 56 | 0 1 0 | 1 1 0 |
| 25 |  | 1 1 1 | 57 |  | 1 1 1 |
| 26 |  | 1 0 0 | 58 |  | 1 0 0 |
| 27 |  | 1 0 1 | 59 |  | 1 0 1 |
| 28 | 1 1 0 | 1 1 0 | 60 | 1 1 0 | 1 1 0 |
| 29 |  | 1 1 1 | 61 |  | 1 1 1 |
| 30 |  | 1 0 0 | 62 |  | 1 0 0 |
| 31 |  | 1 0 1 | 63 |  | 1 0 1 |

(19=1)

APPARATUS FOR GENERATING ADDRESS BIT PATTERNS FOR TESTING SEMICONDUCTOR MEMORY DEVICES

BACKGROUND OF THE INVENTION

1. Field of the Invention

The present invention relates to an apparatus for generating address bit patterns for testing semiconductor memory devices by supplying address data to semiconductor memory devices for the purpose of testing the same.

2. Description of the Related Art

For a better understanding of the present invention, description will first be made of a semiconductor memory device test pattern generating apparatus known heretofore by referring to FIG. 2 of the accompanying drawings. As can be seen from the figure, the test pattern generating apparatus is comprised of a pattern generator 1, an X-address bit selector circuit 2, a Y-address bit selector circuit 3, an X-address translation/memory circuit 4, and a Y-address translation/memory circuit 5.

The pattern generator 1 is so designed as to output (m+1) X-addresses 11 in the form of X-address data $X_0, X_1, \ldots, X_m$ as well as (m+1) Y-addresses 12 in the form of Y-address data $Y_0, Y_1, \ldots, Y_m$, respectively. Both of these X- and Y-address data 11 and 12 are supplied to the X-address bit selector circuit 2 and the Y-address bit selector circuit 3, respectively. The X-address selector circuit 2 selects optionally given address data from the X-addresses data 11 and the Y-address data 12 inputted thereto, to thereby supply (n+1) selected X-address signals 13 to the X-address translation/memory circuit 4 as the selected X-address data $SX_0, SX_1, \ldots, SX_n$.

Similarly, the Y-address bit selector circuit 3 selects optionally given address data from the X-address data 11 and the Y-address data 12 as inputted, whereby (n+1) selected Y-address signals 14 are supplied as the selected Y-address data $SY_0, SY_1, \ldots, SY_n$ to the Y-address translation/memory circuit 5. In response to the input of the selected X-address signals 13, corresponding address data written previously in the X-address translation/memory circuit 4 are read out, resulting in that (p+1) stored X-addresses 17 are Generated as the memory X-address data $MX_0, MX_1, MX_p$.

On the other hand, from the Y-address translation/memory circuit 5, those of the address data are read out which correspond to the selected Y-address signals 14, whereby (p+1) memory Y-addresses 18 are outputted as the memory Y-address data $YM_0, YM_1, \ldots, YM_p$. The memory X-addresses 17 and the memory Y-addresses 18 are supplied as the X-address signal and the Y-address signal to a memory device under test to make access to the memory cells of thereof.

In general, in a semiconductor memory device, the address signals applied to external address terminals of the memory device differ from the address signals actually transmitted to the memory cells of a memory cell array incorporated in the memory device. More specifically, the address signals supplied to the external address terminals usually undergo once an address translation, whereon the address signals resulting from the translation are transmitted to the memory cell array. In this conjunction, there is known a peculiar address translation scheme in which the method for column address translation differs from that for the row address translation on a row-address basis. Furthermore, such a particular address translation may also be realized by selecting optionally the X-address data $X_0, X_1, \ldots, X_m$ and the Y-address data $Y_0, Y_1, \ldots, Y_m$ outputted from the pattern generator 1 by means of the X-address bit selector circuit 2 and the Y-address bit selector circuit 3 and supplying these selected address data to the X-address translation/memory circuit 4 and the Y-address translation/memory circuit 5, respectively. Parenthetically, the circuit configuration shown in FIG. 2 is disclosed in Japanese Unexamined Patent Application Publication No. 246100/1985 (JP-A-60-24100).

Now, let's consider, by way of example, a semiconductor memory device of such a configuration as shown in FIG. 3. This memory device 101 is assumed as being constituted by 64 memory cells arrayed in a matrix of eight rows and eight columns. In general, for making access to the memory cells $a_0, a_1, \ldots, a_{63}$, there are used X-address bit data $AX_0, AX_1$ and $AX_2$ and Y-address bit data $AY_0, AY_1$ and $AY_2$ which are represented by first to sixth bits, respectively, of a binary digit together with address data representing in a binary notation a suffix "k" of the memory cell ID $a_k$ (where k=0, 1, ..., 63), whereby memory cells $a_k$ to be addressed can be designated. On these conditions, when the memory cells $a_0$ to $a_{63}$ are to be sequentially addressed, the address bit data $AY_2, AY_1, AY_0, AX_2, AX_1$ and $AX_0$ are changed in such a manner as is illustrated in FIG. 4.

At this juncture, it should however be noted that a column address decoder 103 dedicated for decoding the X-address data inputted to an external terminal 102 may be configured as shown at 104 in FIG. 3 when $AY_2$="0" while being configured as shown at 105 when $AY_2$="1". More specifically, when $AY_2$="0", the address data $AX_0$ is inverted upon decoding, while the address data $AX_1$ as decoded is inverted when $AY_2$="1". On the other hand, a row address decoder 107 for decoding the Y-address data inputted to the external terminal 106 is implemented in such a configuration as shown at 108, as in the case of the conventional decoder.

Such being the circumstances, in order to allow the memory cells $a_0, a_1, \ldots, a_{63}$ of the semiconductor memory device 101 to be sequentially addressed or accessed, it is required to change the X-address data $AX_0, AX_1$ and $AX_2$ supplied to the external terminal 102 and the Y-address data $AY_0, AY_1$ and $AY_2$ supplied to the external terminal 106 in such a manner as illustrated in FIG. 5. With the structure of the semiconductor memory device 101 described above, it is intended to avoid the use of a concentrated power supply circuit for the memory accessing operation. Of course, the memory structure differs in dependence on the method or process adopted in manufacturing the same.

Thus, by setting the states of the address bit selector circuits 2 and 3 in correspondence to the column address decoder 103 and the row address decoder 107 of the semiconductor memory device 101 under test and writing the contents of the address translation/memory circuits 4 and 5, it is possible to establish coincidence between the addresses generated by the pattern generator 1 and the addresses designating the memory cells of the cell array incorporated in the semiconductor memory device 101 under test.

FIG. 6A illustrates the selecting operation of the X-address selector circuit 2 shown in FIG. 2, and FIG. 6B illustrates the operation of the Y-address bit selector circuit 4 also shown in FIG. 2. Further, the content of the X-address translation/memory circuit 4 is shown in FIG. 7A, while that of the Y-address translation/memory circuit 5 is shown in FIG. 7B. Connection between the memory address outputs 17 and 18 (FIG. 2) and the external terminals 102 and 106 (FIG. 3) are illustrated in FIG. 8.

The semiconductor memory device test pattern generating apparatus described above suffers not a few problems. First, in the case of semiconductor memory device of a large capacity which are increasingly employed in practical applications, the method of allocating the column addresses may differ in dependence on the row addresses. Further, in the case of a memory device susceptible to a multi-bit parallel test, the conditions for translation of the addresses to be supplied to the semiconductor memory device in the test mode may differ from the translation conditions in the normal operation mode. At this juncture, it is noted that with the address translation effected by the test pattern generating apparatus known heretofore, the conditions for the address translation was limited only to a single specification. In other words, the address translation condition once established could not be changed or altered. Besides, it is noted that although the set states of the X- and Y-address bit selector circuits 2 and 3 and the data placed in the X- and Y-address translation/memory circuits 4 and 5 can be altered, it takes intolerably a lot of time, incurring degradation in the efficiency of the inspection or test of the memory device. It should further be pointed out that the conditions for the address translation can not be changed on a real-time basis in the course of the inspection or test.

SUMMARY OF THE INVENTION

In the light of the state of the art, it is an object of the present invention to provide an improved address bit pattern generating apparatus for testing a semiconductor memory device, which apparatus makes it possible to access the memory cells in a sequence as desired, while allowing the conditions for the address translation to be changed on a real-time basis even in the case of the test of a semiconductor memory device where such a complicated addressing scheme is adopted in which the allocation of the column addresses differs from one to another row address.

In view of the above and other objects which will become apparent as description proceeds, there is provided according to an aspect of the present invention an apparatus for generating address bit patterns for testing a semiconductor memory device, which apparatus comprises a pattern generator for outputting a plurality of address signals, a plurality of address bit selector circuits for selecting optionally a plurality of address signals on a bit-by-bit basis, a plurality of switching circuits for changing over a plurality of selected addresses selected by the address bit selector circuits on a real-time basis, and a plurality of address translation/ memory circuits which are supplied with a plurality of the addresses changed over by the switching circuits and in each of which a memory incorporated therein is divided into a plurality of memory areas selectable on a real-time basis, wherein with the selected address changed over by an address switching signal supplied from the pattern generator, the address translation data stored in the memory area selected by the address switching signal are read out, whereby the addresses thus undergone the address translation are supplied to the semiconductor memory device under test for making access to the memory cells of the semiconductor memory device under test.

With the arrangement of the semiconductor memory device test pattern generating apparatus described above, owing to the address translation in which a plurality of address translation conditions can selectively be employed even for the test of the semiconductor memory device in which the address allocation is complicated such that allocation of the column addresses differs from one to another row address, appropriate test bit pattern can be generated by selecting different conditions for the address translation by the plurality of address bit selector circuits from a corresponding number of divided memory areas of the address translation/memory circuits, respectively, to thereby change over or switching the conditions for the address translation on a real-time basis. Thus, the inspection or test of the semiconductor memory device can be performed without involving interruption during the testing process due to the changing-over or alteration of the conditions for the address translation. Thus, the efficiency of the test procedure can be enhanced by changing over the conditions for the address translation on a real-time basis.

The above and other objects, features and advantages of the present invention will better be understood by reading the following description taken in conjunction with the preferred embodiments thereof by reference to the drawings.

BRIEF DESCRIPTION OF THE DRAWINGS

FIG. 4 is a view for illustrating a method for addressing or accessing sequentially the memory cells in the memory device shown in FIG. 3;

FIG. 5 is a view for illustrating another method for addressing sequentially the memory cells in the memory device shown in FIG. 3;

FIGS. 6A and 6B are views for illustrating operations of address bit selector circuits shown in FIG. 2;

FIGS. 7A and 7B are views for illustrating operations of address translation/memory circuits shown in FIG. 2;

FIG. 8 is a view for illustrating connections between memory address signals outputted from the apparatus shown in FIG. 2 and external terminals of the memory device shown in FIG. 3;

FIG. 9 is a view for illustrating a method of accessing or addressing sequentially the memory cells in a normal operation mode-in test pattern generating apparatus according to the present invention;

FIG. 10 is a view for illustrating a method of addressing sequentially the memory cells in a test mode in the apparatus according to the invention;

FIGS. 11A, 11B, 11C and 11D are views for illustrating operations of address bit selector circuits of the test pattern generating apparatus shown in FIG. 1;

FIGS. 12A, 12B, 12C and 12D are views showing contents stored in memory areas of address translation/memory circuits of the test pattern generating apparatus shown in FIG. 1;

FIG. 13 is a view for illustrating relations between X- and Y-addresses;

FIG. 14 is a view for illustrating relations between selected X- and Y-addresses in a normal operation mode;

FIG. 15 is a view for illustrating relations between the selected X- and Y-addresses in a test mode;

FIG. 16 is a view for illustrating relations between memory X- and Y-addresses in a normal operation mode; and FIG. 17 is a view for illustrating relations between memory X- and Y-addresses in a test mode.

DESCRIPTION OF THE PREFERRED EMBODIMENTS

Now, the present invention will be described in detail in conjunction with an exemplary or preferred embodiment thereof by reference to the drawings.

Figure 1:
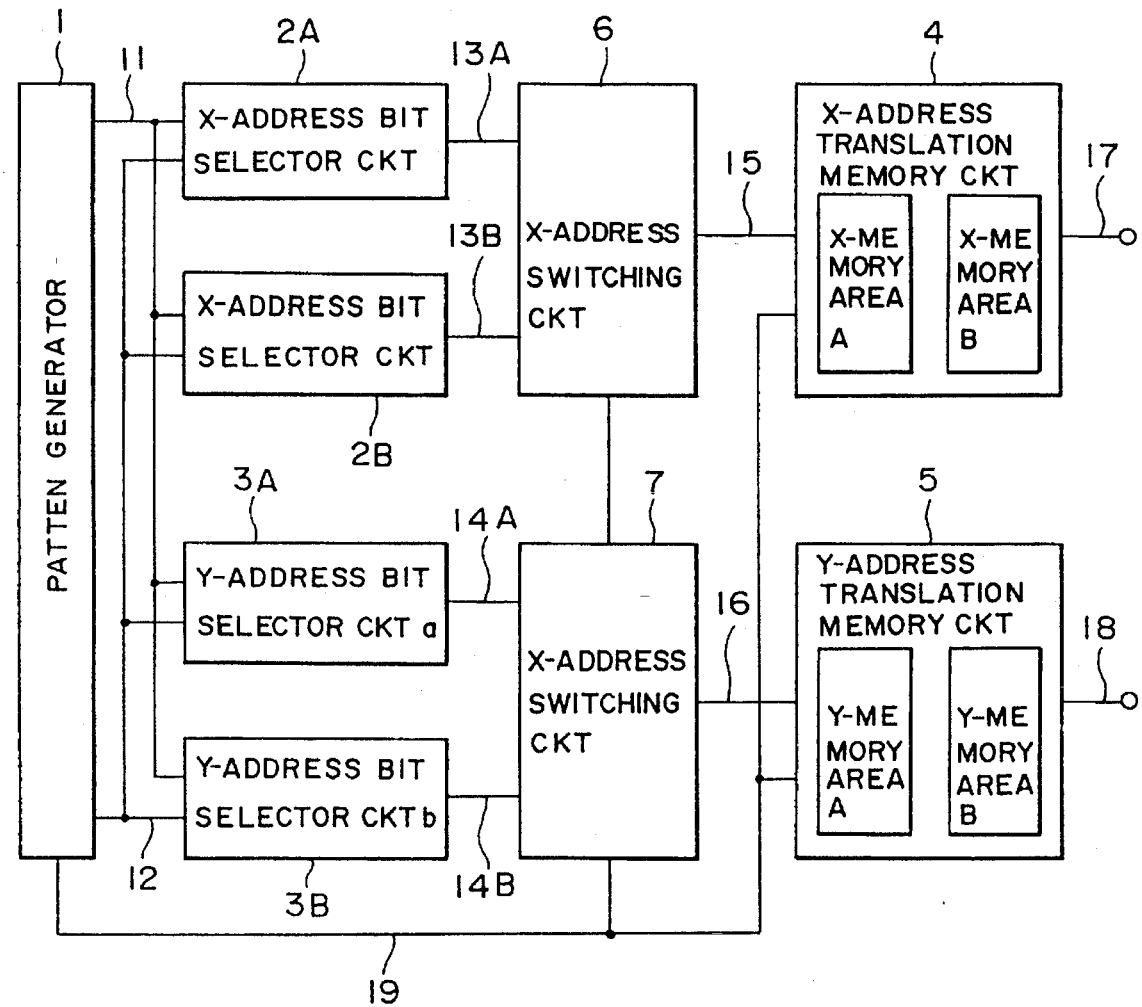
FIG. 1 is a block diagram showing a general arrangement of a semiconductor memory device test pattern generating apparatus according to an embodiment of the present invention.
Figure 2:
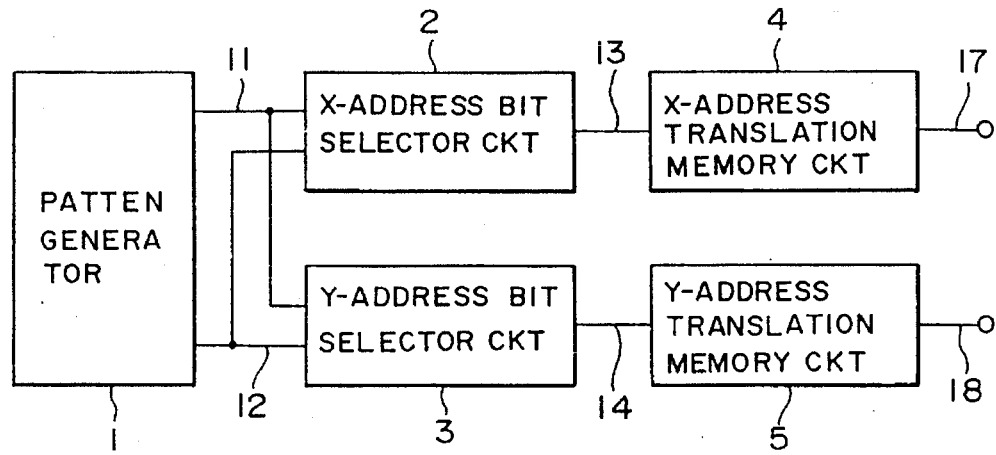
FIG. 2 is a block diagram showing schematically a structure of a semiconductor memory device testing apparatus known heretofore.

FIG. 1 shows generally a structure of an apparatus for generating address bit patterns for testing a semiconductor memory device according to an embodiment of the present invention. In the figure, reference numeral 1 denotes a pattern generator, 2A and 2B denote X-address bit selector circuits, respectively,. 3A and 3B denote Y-address bit selector circuits, respectively, 4 denotes an X-address translation/memory circuit, 5 denotes a Y-address translation/ memory circuit, 6 denotes an X-address switching circuit, and 7 denotes a Y-address switching circuit. The X-address translation/memory circuit 4 incorporates therein an X-memory area A and an X-address memory area B. Correspondingly, the Y-address translation/memory circuit 5 includes a Y-memory area A and a Y-memory area B.

The pattern generator 1 is designed to output (m+1) X-address signals 11 such as X-address data $X_0, X_1, \ldots, X_m$ and (m+1) Y-address signals 12 such as those represented by $Y_0, Y_1, \ldots Y_m$. Both the X-address signals 11 and the Y-address signals 12 are supplied to the X-address bit selector circuits 2A and 2B and the Y-address bit selector circuits 3A and 3B, respectively.

The X-address bit selector circuits 2A and 2B are designed to select optionally given address data from the data represented by the X-address signals 11 and the data represented by the Y-address signals 12 inputted thereto and to supply (n+1) selected X-address data 13A and 13B to the X-address witching circuit 6 as the selected X-address data $SX_0, SX_1, \ldots, SX_n$.

On the other hand, the Y-address bit selector circuits 3A and 3B select optionally given address data from the X-address data 11 and the Y-address data 12 inputted thereto, whereby (n+1) selected Y-address data 14A and 14B are supplied to the Y-address switching circuit 7 as the selected Y-address data $SY_0, SY_1, \ldots, SY_n$. The X-address switching circuit 6 changes over on a real time basis the selected X-address 13A and the selected X-address 13B inputted thereto in response to an address switching signal 19 generated by the pattern generator 1, as a result of which (l+1) switched X-address data 15 are supplied to the X-address translation/memory circuit 4 in the form of the switched X-address data $RX_0, RX, \ldots, RX_l$.

In a similar manner, the Y-address switching circuit 7 responds to the address switching signal 19 supplied from the pattern generator 1 to thereby change over the selected Y-addresses 14A and the selected Y-addresses 14B inputted thereto on a real-time basis, resulting in that (l+1) switched Y-address data 16 are outputted to the Y-address translation/ memory circuit 5 in the form of switched Y-address data $RY_0, RY_1, \ldots, RY_l$.

As mentioned previously, the X-address translation/ memory circuit 4 includes a memory divided into the X-memory area A and the X-memory area B in which certain address data are previously stored, respectively. From these memory areas A and B, data are read out in dependence on the switched X-addresses 15 in response to the address switching signal 19, whereby (p+1) memory X-addresses 17 are outputted in the form of the memory X-addresses $MX_0, MX_1, \ldots, MX_p$.

Similarly, the Y-address translation/memory circuit 5 includes a memory divided into the Y-memory area A and the Y-memory area B in which certain address data are previously loaded. In response to the address switching signal 19, address data are read out from the Y-memory areas A and B in dependence on the switched Y-address data 16 and outputted as (p+1) memory Y-addresses 18 in the form of $MY_0, MY_1, \ldots, MY_p$. Thus, the memory X-addresses 17 and the memory Y-addresses 18 are made available as the X-addresses and the Y-addresses for making access to the memory cells of a semiconductor memory device under test.

Figure 3:
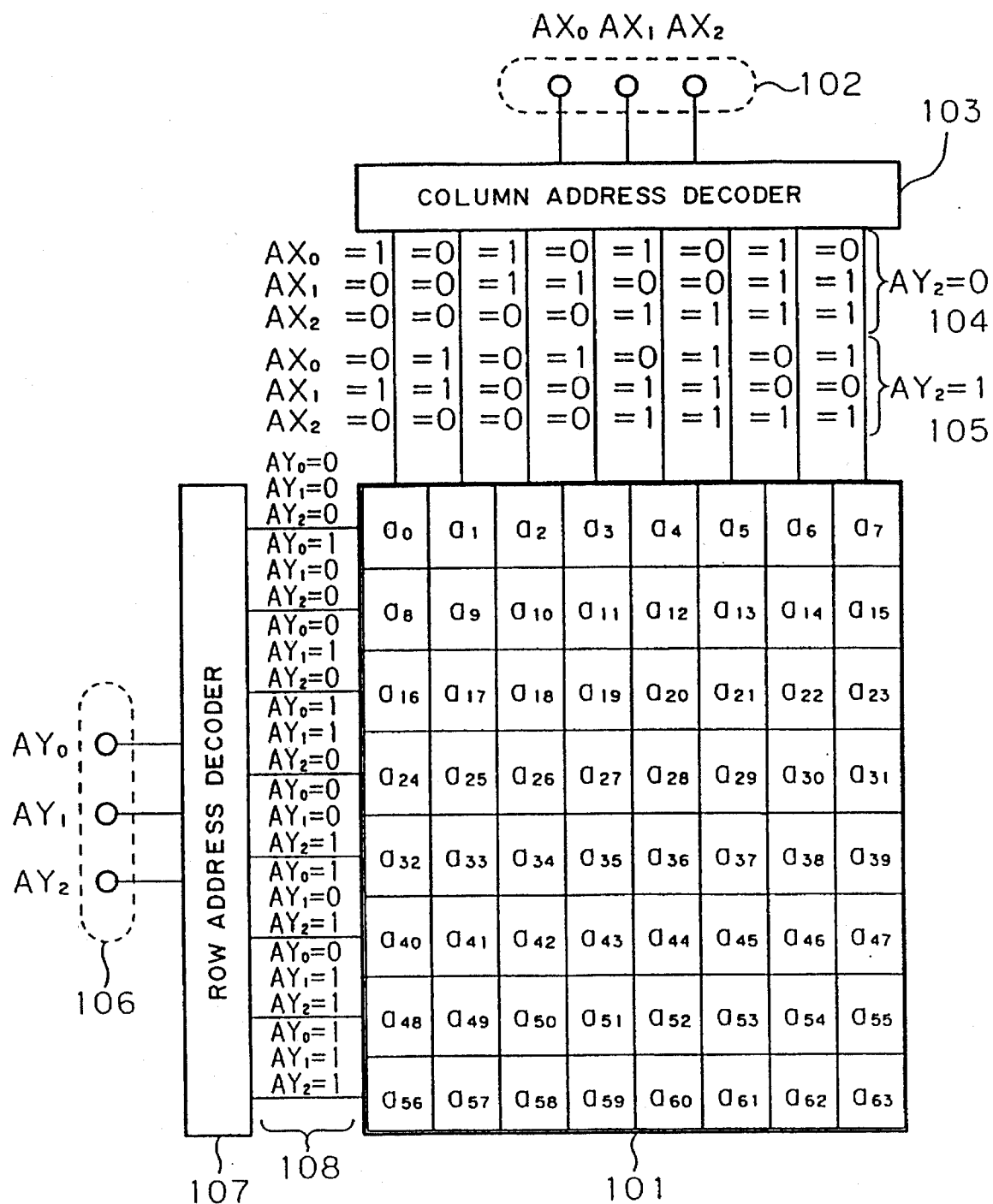
FIG. 3 is a diagram showing a memory cell array in a semiconductor memory device to be tested.

When a semiconductor memory device 101 which is susceptible to a multi-bit parallel test and in which a complicated addressing scheme is employed such that the allocation of the column addresses differ from one to another row address, as shown in FIG. 3, is placed in the test mode as well as in the normal operation mode, and when the memory cells $a_0$ to $a_{63}$ are to be sequentially addressed or accessed, it is required to change over two address translation conditions on a real-time basis.

When the memory cells $a_0$ to $a_{63}$ are to be sequentially designated or addressed in the normal mode, it is required to supply the X-address data $AX_0, AX_1, \ldots, AX_2$ and the Y-address data $AY_0, AY_1, \ldots, AY_2$ to the external terminals 102 and 106 (FIG. 3), respectively, in such a manner as illustrated in FIG. 9. Further, in the test mode where the Y-address data $AY_0$ is omitted, it is necessary to supply the X- and Y-address data in such a manner as shown in FIG. 10 in order to make access to the memory cells $a_0$ to $a_7$, $a_{16}$ to $a_{23}$, $a_{32}$ to $a_{39}$ and $a_{48}$ to $a_{55}$ in this sequence.

Next, description will be made of the states or contents of the components used in the normal operation mode and the text mode. The contents or states of the X-address bit selector circuit 2A and the Y-address bit selector circuit 3A in the normal operation mode are illustrated in FIGS. 11A and 11B, respectively. Additionally, the contents of the X-memory area A of the X-address translation/memory circuit 4 and that of the Y-memory area A of the Y-address translation/memory circuit 5 in the normal operation mode are illustrated in FIGS. 12A and 12B, respectively. Further, the contents or states of the X-address bit selector circuit 2B and the Y-address bit selector circuit 3B in the test mode are illustrated in FIGS. 11C and 11D, respectively. The contents or states of the X-memory area B of the X-address translation/memory circuit 4 and that of the Y-memory area B of the Y-address translation/memory circuit 5 in the test mode are illustrated in FIGS. 12C and 12D, respectively.

The X-address signal 11 (address data "$X_2, X_1, X_0$") and the Y-address signal 12 (address data "$Y_2, Y_1, Y_0$") outputted from the pattern generator 1 are supplied to the X-address bit selector circuits 2A and 2B and the Y-address bit selector circuits 3A and 3B, respectively, as shown in FIG. 13. The X-address data 13A and 13B "$SX_2, SX_1, SX_0$" as selected by the X-address bit selector circuits 2A and 2B in such a manner as shown in FIGS. 11A and 11B are outputted to the X-address switching circuit 6, as shown in FIGS. 14 and 15. Similarly, the Y-addresses 14A and 14B "$SY_2, SY_1, SY_0$" selected by the Y-address bit selector circuits 3A and 3B, as shown in FIGS. 11B and 11C, are outputted to the Y-address switching circuit 7 in such a manner as shown in FIGS. 14 and 15.

In response to the address switching signal 19 supplied from the pattern generator 1, the X-address switching circuit 6 outputs to the X-address translation/memory circuit 4 the selected X-addresses 13A in the normal operation mode while outputting the selected X-addresses 13B as the switched X-addresses 15 in the test mode. Thus, the switched X-addresses 15 "$RX_2, RX_1, RX_0$" produced by the X-address switching circuit 6 are outputted to the X-address translation/memory circuit 4 in such a manner as shown in FIG. 14 in the normal operation mode while outputted in such a manner as illustrated in FIG. 15 in the test mode.

The Y-address switching circuit 7 responds to the address switching signal 19 supplied from the pattern generator 1 to thereby output as the switched Y-addresses 16 the selected Y-addresses 14A in the normal mode while outputting the selected Y-address 14B in the test mode, whereby the selected Y-addresses 14A or 14B are supplied to the Y-address translation/memory circuit 5. Thus, the switched Y-addresses 16 "$RY_2, RY_1, RY_0$" outputted from the Y-address switching circuit 7 are supplied to the Y-address translation/memory circuit 5 as illustrated in FIG. 14 in the normal operation mode while outputted in such a manner as illustrated in FIG. 15 in the test mode.

The X-address translation/memory circuit 4 responds to the address switching signal 19 supplied form the pattern generator 1 to select the X-memory area A in the normal operation mode while selecting the X-memory area B in the test mode, whereby the contents or address data in the X-memory area A or B are read out in response to the switched X-addresses 15, resulting in that the memory X-addresses 17 are outputted. In this manner, the memory X-address data 17 "$MX_2, MX_1, MX_0$" read out from the X-address translation/memory circuit 4 are outputted as shown in FIG. 16 in the normal operation mode while being outputted as shown in FIG. 17 in the test mode.

On the other hand, the Y-address translation/memory circuit 5 responds to the address switching signal 19 supplied from the pattern generator 1 to thereby select the Y-memory area A in the normal operation mode while selecting the Y-memory area B in the test mode, whereby the memory Y-addresses 18 are read out in response to the switched Y-addresses 16 as inputted. Thus, the memory Y-address data 18 "$MY_2, MY_1, MY_0$" read out from the Y-address translation/memory circuit 5 are outputted as shown in FIG. 16 in the normal operation mode while being outputted as shown in FIG. 17 in the test mode.

Since the memory X-addresses 17 and the memory Y-addresses 18 are supplied as the X-addresses and the Y-addresses for the semiconductor memory device, as is apparent form the foregoing description, the connection shown in FIG. 8 allows these addresses to be supplied to the memory cell array in a manner shown in FIG. 9 in the normal operation mode while the addresses are supplied to the memory cell array in a manner shown in FIG. 10 in the test mode, whereby the memory cells can be accessed in a desired sequence.

In the case of the embodiment described above, the two conditions for the address translation are changed over on a real-time basis. However, in more general terms, it can be said that by providing a plurality of address bit selector circuits together with a corresponding number of the divided memory areas in the address translation/memory circuits, a plurality of conditions for the address translation can be changed over on a real-time basis.

As can now be understood from the foregoing description, with the structure of the memory device test pattern generating apparatus according to the present invention in which a plurality of address translation conditions can selectively be employed, desired test patterns can be generated even for testing the semiconductor memory device in which such complicated addressing scheme is adopted that allocation of the column addresses differs from one to another row address, owing to the arrangement that different conditions for the address translation can be selected through cooperation of the plurality of address bit selector circuits and a corresponding number of divided memory areas of the address translation/memory circuits, respectively, and changed over for the desired address translations on a real-time basis. Thus, the inspection or test of the memory device can be performed on a real-time basis without involving interruptions during the testing process due to the changing-over or alteration of the conditions for the address translation. Thus, the efficiency of the test procedure can significantly be enhanced.

Many features and advantages of the present invention are apparent form the detailed specification and thus it is intended by the appended claims to cover all such features and advantages of the system which fall within the true spirit and scope of the invention. Further, numerous modifications and changes will readily occur to those skilled in the art. Accordingly, it is not desired to limit the invention to the exact construction and operation illustrated and described, being understood that all suitable modifications and equivalents may be resorted to, falling within the scope of the invention.

We claim:

1. An apparatus for generating address bit patterns to be provided to a semiconductor memory device under test, the apparatus comprising:

a pattern generator for outputting a plurality of address signals on a bit-by-bit basis and for outputting an address switching signal;

a plurality of X-address bit selector circuits, each X-address bit selector circuit for receiving the address signals from the pattern generator, arbitrarily selecting X-address data based on the received address signals on a bit-by-bit basis, and outputting the selected X-address data;

a plurality of Y-address bit selector circuits, each Y-address bit selector circuit for receiving the address signals from the pattern generator, arbitrarily selecting Y-address data based on the received address signals on a bit-by-bit basis, and outputting the selected Y-address data;

an X-address switching circuit for receiving the address switching signal from the pattern generator and the selected X-address data from each X-address bit selector circuit, switching the received X-address data on a real time basis based on the address switching signal, and outputting the switched X-address data;

a Y-address switching circuit for receiving the address switching signal from the pattern generator and the selected Y-address data from each Y-address bit selector circuit, switching the received Y-address data on a real time basis based on the address switching signal, and outputting the switched Y-address data;

an X-address translation / memory circuit having a memory divided into a plurality of memory areas selectable on a real-time basis, the X-address translation / memory circuit for receiving the address switching signal from the pattern generator and the switched X-address data from the X-address switching circuit, storing the received X-address data in the memory areas, reading from the memory the stored X-address data based on the address switching signal, and outputting the memory X-address data; and a Y-address translation / memory circuit having a memory divided into a plurality of memory areas selectable on a real-time basis, the Y-address translation / memory circuit for receiving the address switching signal from the pattern generator and the switched Y-address data from the Y-address switching circuit, storing the received Y-address data in the memory areas, reading from the memory the stored Y-address data based on the address switching signal, and outputting the memory Y-address data;

wherein the outputted memory X-address data and memory Y-address data are respectively supplied to X-address terminals and Y-address terminals of the semiconductor memory device under test for accessing memory cells within the semiconductor memory device.

* * * * *